United States Patent

Sugawara

[11] Patent Number: 5,945,842
[45] Date of Patent: Aug. 31, 1999

[54] OUTPUT CIRCUIT FOR CONVERSION FROM CMOS CIRCUIT LEVEL TO ECL CIRCUIT LEVEL

[75] Inventor: Michinori Sugawara, Tokyo, Japan

[73] Assignee: NEC Corporation, Japan

[21] Appl. No.: 08/883,874

[22] Filed: Jun. 27, 1997

[30] Foreign Application Priority Data

Jun. 28, 1996 [JP] Japan .................................. 8-168947

[51] Int. Cl.[6] .............................................. H03K 19/0175
[52] U.S. Cl. .................................. 326/66; 326/31; 326/84
[58] Field of Search .................................. 326/64, 66–67, 326/63, 84, 109–110, 31–34

[56] References Cited

U.S. PATENT DOCUMENTS 4,912,347  3/1990  Morris ........................................ 326/66
5,670,893  9/1997  Okamura .................................... 326/84

FOREIGN PATENT DOCUMENTS 7-70983  7/1995  Japan .

Primary Examiner—Jon Santamauro
Attorney, Agent, or Firm—Ostrolenk, Faber, Gerb & Soffen, LLP

[57] ABSTRACT

A first load 10 is connected between a signal terminal 12 for driving an output transistor 11 and a highest potential VCC. A first switch 7 is connected in parallel with the first load 10. A second switch 8 is connected between the signal terminal 12 and a current source 14. A third switch 9 is connected between the highest potential VCC and the current source 14. The first to third switches are on-off operated according to a CMOS level input to provide an ECL level from an output transistor. The current source 14 includes a bipolar transistor 1 and a resistor 2, thereby occupying only a small area and precluding output fluctuations due to fluctuations in manufacture.

38 Claims, 8 Drawing Sheets

OUTPUT CIRCUIT FOR CONVERSION FROM CMOS CIRCUIT LEVEL TO ECL CIRCUIT LEVEL

BACKGROUND OF THE INVENTION

The present invention relates to output circuits for level conversion from the logic level of a complementary metal-oxide-semiconductor (CMOS) circuit to the logic level of an emitter-coupled logic (ECL) circuit.

Japanese Patent Publication No. 7-70983 shows an output circuit which performs level conversion from the CMOS circuit level to the ECL circuit level. As shown in FIG. 7, this circuit comprises a CMOS inverter 31 including PMOS and NMOS transistors 31a and 31b, PMOS and NMOS transistor 32 and 33 with the gates thereof connected to the output of the CMOS inverter 31, a bipolar transistor 37 as an emitter follower, which has the base connected to the drain signal terminal of the two MOS transistors 32 and 33, the collector connected to a highest potential VCC and the emitter connected to a resistor 30 and also to an output terminal 38, an output resistor 36 connected between the highest potential VCC and the base signal terminal 39 of the bipolar transistor 37, a current source 34 connected to the source of the NMOS transistor 33, and a voltage source 35 for providing a potential VS to the current source 34.

The current source 34, as shown in FIG. 8, includes an operational amplifier 40, an NMOS transistor 41 for receiving at the gate thereof the output of the operational amplifier 40, a resistor 42 connected to the source of the NMOS transistor 41, and current mirrors 43 and 44 including PMOS transistors 43a and 43b, and NMOS transistors 44a and 44b, respectively. The operational amplifier 40 has the non-inverted input terminal driven by the voltage source 35 and the inverted input terminal connected to the source of the NMOS transistor 41. In the current source 34, the NMOS transistor 41 is held substantially at the same source potential as the potential VS provided by the voltage source 35 owing to a high open-loop gain of the operational amplifier 40. The current in the resistor 42 is thus given by the ratio (VS−VSS)/R42 between the resistance R42 of the resistor 42 and the voltage VS−VSS. This current is reflected by the current mirror 43 and then reflected by the current mirror 44 to become a current into the current source 34.

In the output circuit shown in FIG. 7, whether the PMOS and NMOS transistors 32 and 33 are selectively turned on or off, determines whether the current of the current source 34 noted above flows through the output resistor 36 or not, which in turn determines whether a high or a low ECL level is provided to the output terminal 38. When it is designed that a voltage drop of 1 V, for instance, is produced across the output resistor 36 by a current caused therethrough, a low ECL level of −1.8 V is provided to the output terminal 38 by the base-emitter voltage across the output bipolar transistor 37. The voltage drop across the output resistor 36 is determined by the supply voltage VS of the voltage source 35 and the resistance ratio between the resistors 36 and 42. The voltage drop thus is not affected by absolute fluctuations of the resistances of the resistors in manufacture (fluctuations of resistances on the same chip being called relative fluctuations, which are less than the absolute fluctuations). This means that the output level is not affected by the absolute fluctuations of the resistances.

The above prior art output circuit has the following problems. A first problem is that the current source of the output circuit occupies a very large area. This is so because the current circuit includes a large number of elements, i.e., four MOS transistors, an operational amplifier and a resistor. A second problem is that the output level fluctuates greatly due to MOS transistor gate size fluctuations. This is so because the output circuit uses the MOS transistor current mirrors. The fluctuations can be greatly reduced by extremely increasing the MOS transistor gate width. By so doing, however, the area of the current source is increased.

The above problems will be discussed in greater details. Regarding the width and length of the gate of the MOS transistors of the current source 34, according to the above patent publication it is possible to set the width and length of the gate of the PMOS transistors 43a and 43b to 50 μm and 5 μm, respectively, set those of the gate of the NOMS transistor 44a to 10 μm and 2 μm, respectively, and set those of the gate of the NMOS transistor 44b to 100 μm and 2 μm, respectively. Obviously, the current source which includes many elements, i.e., the four transistors and a further transistor 41 as well as the resistor 42 and the operational amplifier 40 (an operational amplifier shown in, for instance, P. R. Gray and R. G. Mayer, translated by Yuzuru Nagata, "Analog Integrated Circuit Design Techniques, Part II", page 227, FIG. 12.38, including twelve MOS transistors and three bias current sources), occupies a large area.

Reducing the MOS transistor gate size to reduce the occupied area, leads to a problem of ECL output level fluctuations due to gate size fluctuations in manufacture, which will now be discussed. When the gate length is set to a minimum of 0.5 μm while maintaining the ratio between the width and the length of the gate, the width and the length of the gate of the PMOS and NMOS transistors 43a and 43b are 5 μm and 0.5 μm, respectively, those of the gate of the NMOS transistor 44a are 2.5 μm and 0.5 μm, respectively, and those of the gate of the NMOS transistor 44b are 25 μm and 0.5 μm, respectively. When the reference gate width error in a lot manufacture process is set to 10% of the minimum width, i.e., 0.05 μm, fluctuations are produced in the current mirror 44 in FIG. 8. The center value of the gate width ratio between the transistors 44a and 44b is 10. When a gate width error of 0.05 μm is produced, the gate widths of the NMOS transistors 44a and 44b are changed to 2.55 μm and 25.05 μm, respectively, changing the gate width ratio to 25.05/2.55=9.82. This value is a 2% deviation from the center value.

This deviation corresponds to a reference current deviation from the case where the gate width has the center value. In this case, when the output level is "low", a voltage drop of 1 V is produced across the output resistor 36, and 2% of this voltage, i.e., 20 V, is the reference deviation of the output voltage. When it is estimated that three times the reference deviation is the maximum deviation that actually occurs, the output level deviation is ±60 V, width 120 V. Since the rated ECL output level deviation width is 220 V, the fact that more than one half the rated deviation width of 120 Mv is introduced by the above gate width error, leads to such undesired results as cost increase due to yield reduction or the like in the actual construction.

SUMMARY OF THE INVENTION

An object of the present invention is to provide an output circuit, which occupies a reduced area and is less prone to output level fluctuations.

According to an aspect of the present invention, there is provided an output circuit comprising a first load connected between a signal terminal for driving an output transistor and a highest potential, a first switch connected in parallel with the first load, a second switch connected between the signal terminal and a current source, the first and second switches being on-off operated by a CMOS level input to provide an ECL level from the output transistor, and a third switch which is connected between the highest potential and the current source, the first to third switches being coupled for being simultaneously on-off operated, the current source including a bipolar transistor coupled to a resistor.

According to another aspect of the present invention, there is provided an output circuit comprising a first load connected between a signal terminal for driving an output transistor and a highest potential, a first switch connected in parallel with the first load, a second switch connected between the signal terminal and a current source, a third switch connected between the highest potential and the current source, the first to third switches being coupled for being on-off operated according to a CMOS level input to provide an ECL level from the output transistor, and the current source including a bipolar transistor coupled to a resistor.

According to another aspect of the present invention, there is provided an output circuit comprising an output bipolar transistor as an emitter follower, with the emitter connected to a resistor and to an output terminal, and the collector connected to a highest potential, a first switch and a load connected in parallel between the highest potential and a signal terminal, a current source connected via a second switch to the signal terminal, a third switch connected between the highest potential and the current source, the current source including a bipolar transistor coupled to a resistor, and being operated by a supply voltage supplied by a voltage source, the first to third switches being coupled for being on-off operated according to CMOS level inputs to input terminals, respectively, and the first and third switches being simultaneously on-off operated, while the second switch being simultaneously reversely on-off operated.

According to another aspect of the present invention, there is provided an output circuit comprising a CMOS inverter including a PMOS transistor and an NMOS transistor, two PMOS transistors as first and third switches, respectively, with the gates thereof connected to the output line of the CMOS inverter, an NMOS transistor as a second switch, a first resistor as a first load, which has one terminal connected to the drains of the PMOS and NMOS transistors of the first and second switches, and the other terminal connected to a highest potential, an output bipolar transistor with the base thereof connected to the one terminal of the first resistor, a second resistor connected to the drain of the PMOS transistor, of the third switch and a current source including a bipolar transistor coupled to a resistor.

Other objects and features will be clarified from the following description with reference to attached drawings.

PREFERRED EMBODIMENTS OF THE INVENTION

Figure 1:
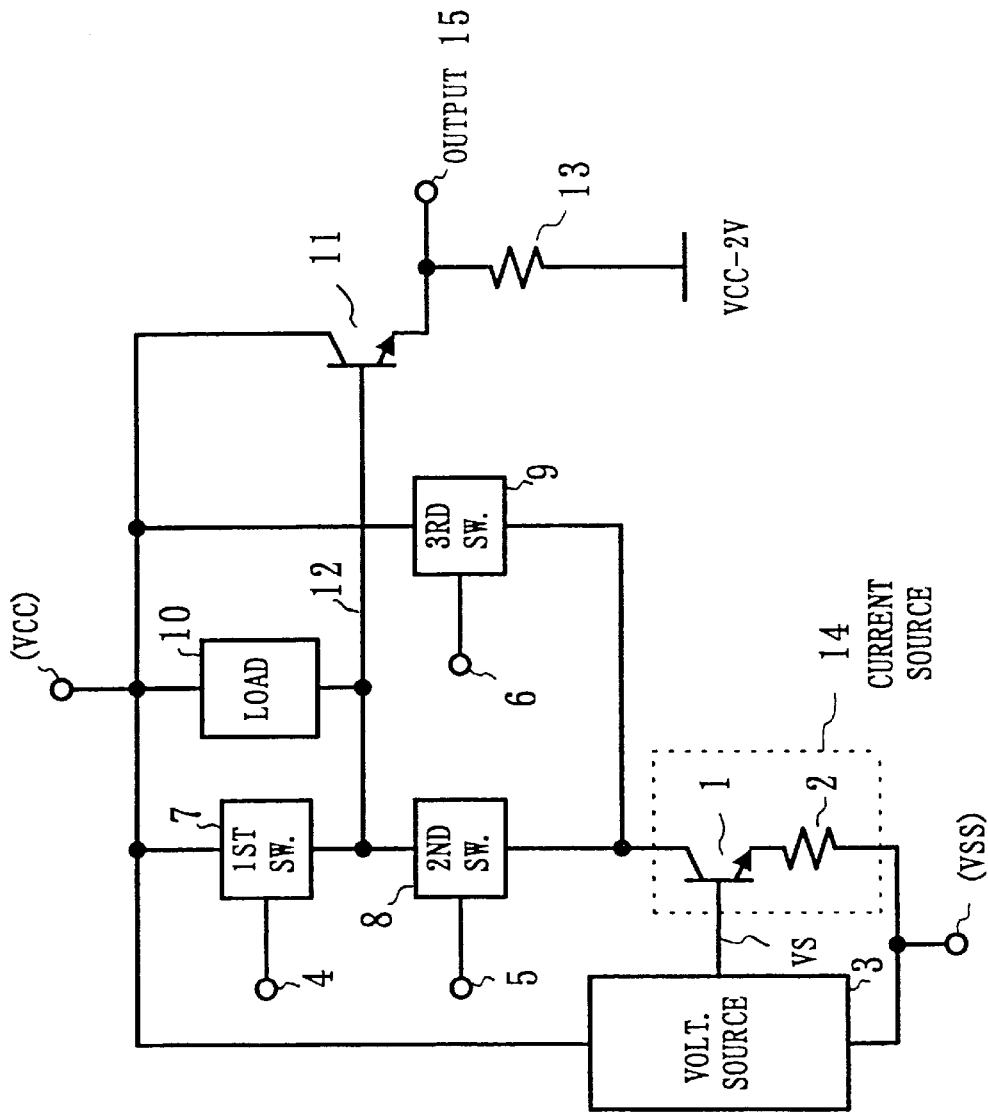
FIG. 1 is a circuit diagram showing a first embodiment of the output circuit according to the present invention.

Embodiments of the present invention will now be described with reference to the drawings. FIG. 1 is a circuit diagram showing a first embodiment of the output circuit according to the present invention. In this output circuit, an output bipolar transistor 11 as an emitter follower, with the emitter connected to a resistor 12 and also to an output terminal 15, is connected to the highest potential VCC. A first switch 7 and a load 10 are connected in parallel between the highest potential VCC and a signal terminal 12, i.e., an input terminal to the base of the transistor 11. A current source 14 is connected via a second switch 8 to the signal terminal 12. A third switch 9 is connected between the highest potential VCC and the current source 14. The current source 14 includes a bipolar transistor 1 and a resistor 2, and is operated by the supply voltage VS supplied by the voltage source 3. The first to third switches 7 to 9 are on-off operated according to CMOS level inputs supplied to input terminals 4 to 6, respectively. The first and third switches 7 and 9 are simultaneously on-off operated, while the second switch 8 is simultaneously reversely on-off operated.

In this output circuit, when the second switch 8 is turned on by a CMOS level input, the current source 14 provides a current through the load 10 and holds the signal terminal 12 to be at a "low" level, thus providing a "low" ECL level at the output terminal 15. When the second switch 8 is turned off, the first and third switches 7 and 9 are turned on. As a result, the current source 14 causes a current to flow from VCC through the third switch 9 to it, while the signal terminal 12 is short-circuited to VCC by the first switch 7. A "high" ECL level is thus provided at the output terminal 15. In this way, the CMOS level is converted to the ECL level. In this circuit, the third switch 9 permits current supply from the current source 14 to the collector of the bipolar transistor 1 even in the "off" state of the second switch 8, and saturation of the bipolar transistor 1 does not occur.

As shown above, in the first embodiment of the present invention in which the current source 14 is constituted by the bipolar transistor and the resistor, the circuit construction is extremely simplified compared to the prior art circuit using the MOS transistor current mirrors and operational amplifier, and its occupied area can be reduced. Moreover, since the circuit does not use any MOS transistor, the characteristics of which are greatly affected by fluctuations in manufacture, it is possible to reduce output level fluctuations due to fluctuations in manufacture.

Figure 2:
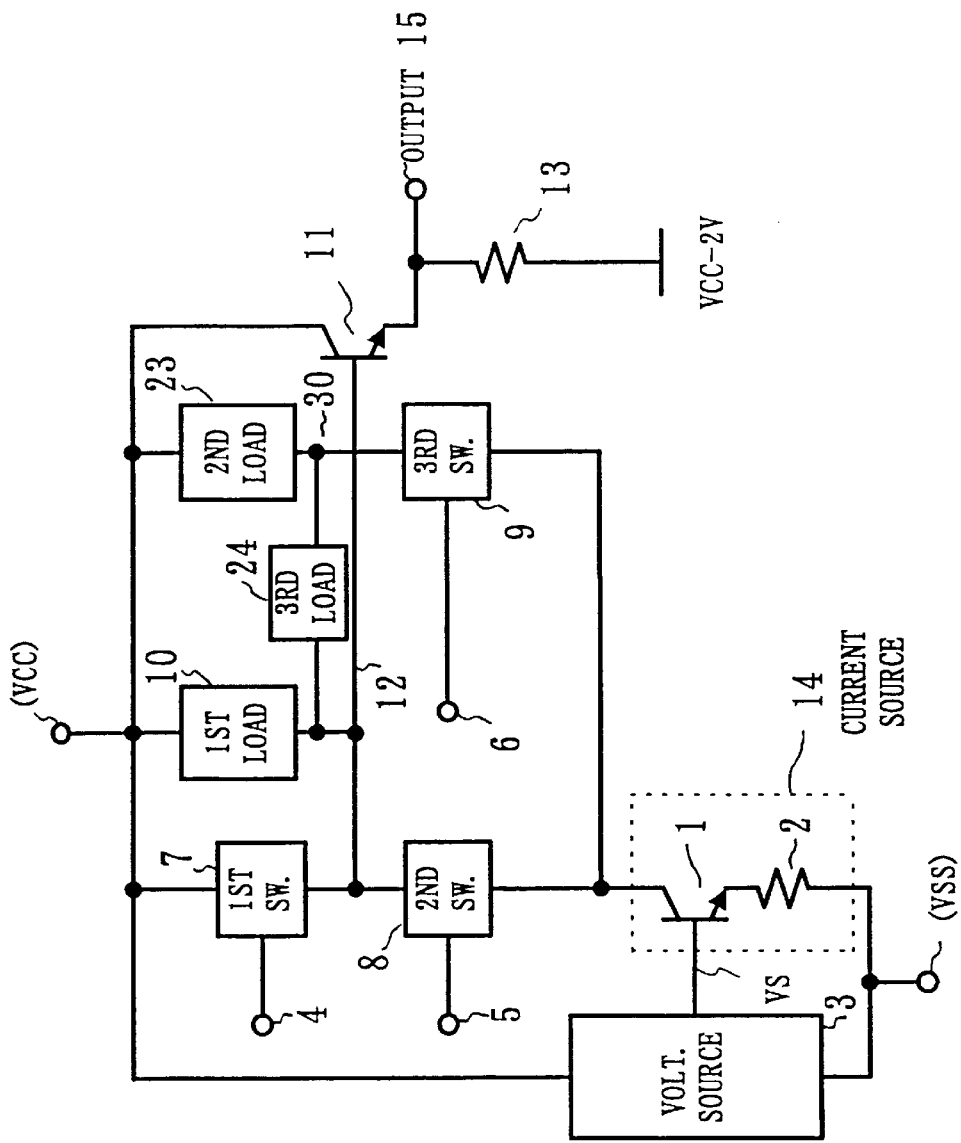
FIG. 2 shows a second embodiment of the present invention.

FIG. 2 shows a second embodiment of the present invention. This embodiment of the output circuit is the same as the preceding first embodiment except for that it further comprises a second and third loads 23 and 24. The second load 23 is connected between the third switch 9 and VCC. The third load 24 is connected between the terminal between the second load 23 and the third switch 9, side and the terminal between the load 10 (hereinafter referred to first load) and the signal terminal 12. The third load 24 has a temperature-dependent current-voltage characteristic, so that it carries a current varying with temperature.

Again in the second embodiment, like the first embodiment, the current source 14 is constituted by the bipolar transistor 1 and the resistor 2, so that it is possible to reduce the occupied area and output level fluctuations. As for the output characteristic, the third load 24 permits variation of the temperature dependency of the potential at the signal terminal 12 from the case where it is not provided; for instance, it is possible to permit provision of the temperature-independent ECL standard output level called ECL100K.

Figure 3:
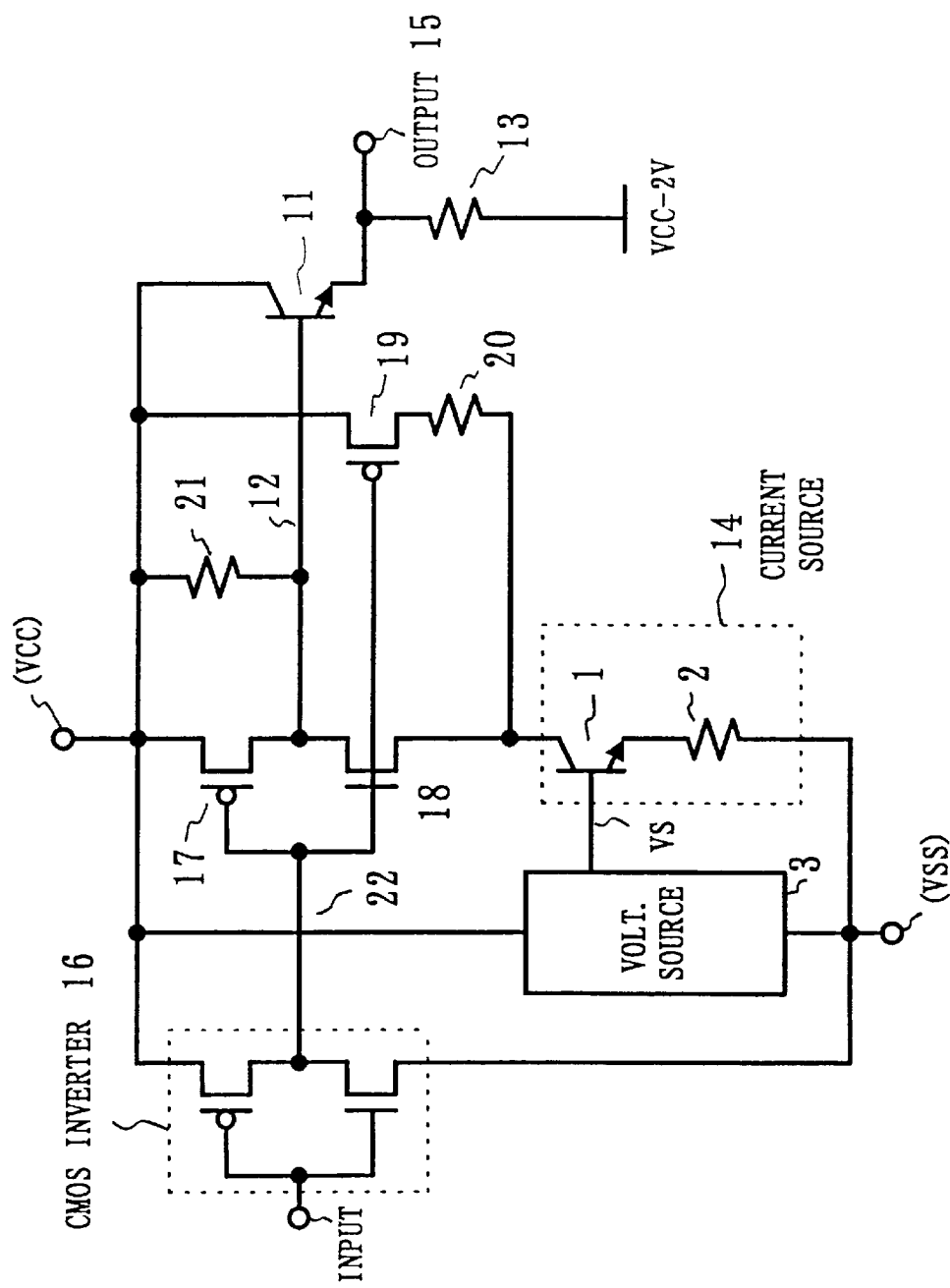
FIG. 3 shows a first example of a specific circuit construction pertaining to the first embodiment of the present invention.

FIG. 3 shows a first example of a specific circuit construction pertaining to the above first embodiment of the present invention. The circuit comprises a CMOS inverter 16 including a PMOS and an NMOS transistor, PMOS transistors 17 and 19 as a first and a third switch, respectively, with the gates thereof connected to the output line 22 of the CMOS inverter 16, an NMOS transistor 18 as a second switch, a resistor 21 as a first load, which has one terminal connected to the drain of the PMOS and NMOS transistors 17 and 18 and the other terminal connected to VCC, an output bipolar transistor 11 with the base thereof connected to the resistor 21, a resistor 20 connected to the drain of the PMOS transistor 19, and a current source 14 including a bipolar transistor 1 and a resistor 2.

It is now assumed that VCC=0 V, VSS=–5 V, VS=VSS+ 1.3 V=–3.7 V. It is also assumed that the bipolar transistor 1 comprises, in layout, two parallel bipolar transistors with an emitter area of 1 $\mu$m×10 $\mu$m=10 $\mu m^2$. It is further assumed that the resistor 2 has a resistance of 250 $\Omega$ and the resistor 21 as the first load has a resistance of 500 $\Omega$. As an input to the signal line 22 appears the CMOS level from the CMOS inverter (of 0 V as "high" level and –5 V as "low" level). When the CMOS level is inverted to the "high" level, the CMOS transistor 18 is turned off, while the PMOS transistors 17 and 19 are turned off. As a result, assuming that the forward voltage VBE1 across the bipolar transistor 1 is 0.8 V, a voltage of VS–VSS–VBE1=0.5 V is produced across the resistor 2, causing a current of 0.5 V/250 $\Omega$=2 mA into the current source 14. Since this current passes through the NMOS transistor 18 and the resistor 21, the potential at the signal terminal 12 becomes "low" level –2 mA×500 $\Omega$=–1 V. Thus, assuming the forward voltage across the bipolar transistor 11 to be approximately 0.76 V, –1.76 V is provided as the "low" ECL level to the output terminal 15.

When the CMOS level as the input to the signal line 22 is "low" level, the NMOS transistor 18 is turned off, while the PMOS transistors 17 and 19 are turned on. As a result, a current of 2 mA is caused from the current source 14 through the PMOS transistor 19, inverting the potential at the signal terminal 12 to the "high" level. Since the bipolar transistor 11 causes a current of approximately 20 mA as will be seen later, assuming a current gain of 100, a base current of approximately 0.2 mA is caused and produces a voltage drop across the resistor 21. The potential at the signal terminal 12 is thus brought to approximately –100 mV. Also, the forward voltage across the bipolar transistor 11 is slightly increased by the fact that a current, which is 4 to 5 times the current that was caused when the previous "low" level was provided, specifically approximately 0.8 V, is caused at this time. A "high" ECL level of –0.9 V is thus provided to the output terminal 15. At this time, the bipolar transistor 11 obviously carries a current of approximately 20 mA. When the ECL level provided by the output circuit is "low", the voltage drop across the bipolar transistor 11 due to the base current therein is as low as approximately 20 mA, and was ignored.

As shown above, the output circuit according to the present invention converts the CMOS level to the ECL level.

The ECL level that is provided can be compliant with the ECL10k standard such that the output is increased when the temperature is increased. By selecting a suitable resistance of the resistor 20, the collector potential on the bipolar transistor 1 may be made the same when the NMOS transistor 18 is turned on and when the PMOS transistor 19 is turned on. However, with this arrangement, noise can occur due to great collector potential variations, for instance base potential noise due to the collector-base capacitance.

As for the occupied area of the current source 14, in this embodiment the current source 14 is constituted by only a bipolar transistor with an emitter area of 10 $\mu m^2$ and one resistor with a resistance of 250 $\Omega$. Obviously the occupied area is far smaller than, i.e., a fraction of, the occupied area of the prior art current source, which comprises an operational amplifier, five MOS transistors and a resistor. Regarding the influence of the fluctuations in manufacture on the terminal voltage across the resistor 21 as the load, assuming that the assumed reference gate width deviation 0.05 $\mu$m mentioned earlier in connection with the prior art example is also applicable to the emitter size of the bipolar transistor 1, it will be seen that the reference emitter area error is about 2%. In the bipolar transistor 1, this error corresponds to a forward voltage deviation of $V_t$ln (1.05)=26 mV ×0.05=1.3 mV ($V_t$ being a thermal voltage). Twice this value is the deviation appearing in the terminal voltage across the resistor 21, and is 2.6 mV, which is very low, i.e., one-eighth of approximately 20 mV, the value in the prior art example.

Figure 4:
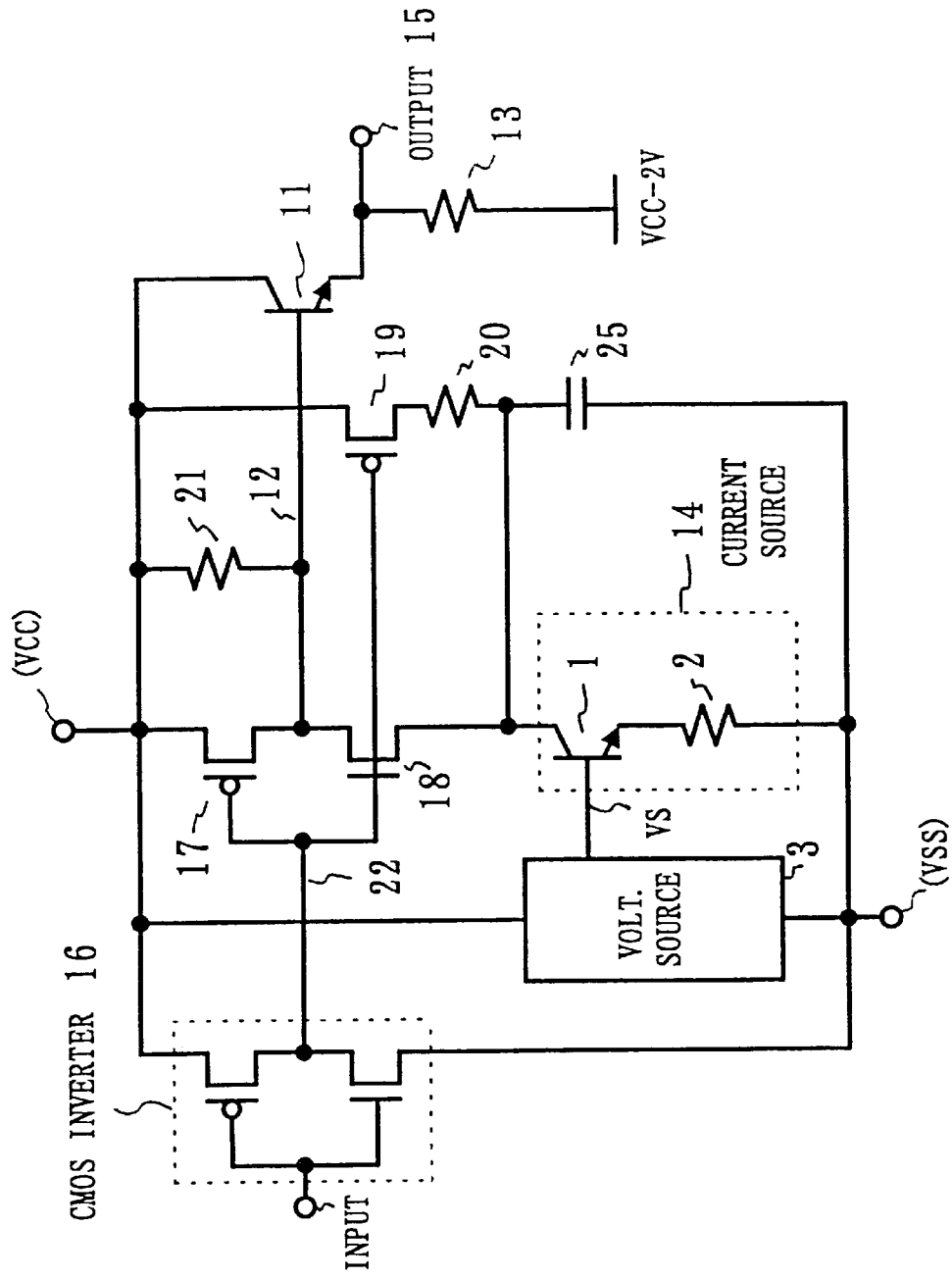
FIG. 4 shows a second example of a specific circuit construction pertaining to the first embodiment of the present invention.

FIG. 4 shows a second example of a specific circuit construction pertaining to the first embodiment of the present invention. This example is the same as the first embodiment except that a capacitor 25 is connected between the collector of the bipolar transistor 1 of the current source 14 and VSS. The capacitor 25 has a role of suppressing fluctuations of the collector potential on the bipolar transistor 1 when the MOS transistors 18 and 19 are switched, thus suppressing base potential noise due to the base-collector capacitance coupling. When noise is introduced into the base potential, as in the arrangement of FIG. 3, for example, the collector current is varied, resulting in undesired noise introduction into the output level. The capacitor 25 can suppress such noise.

Figure 5:
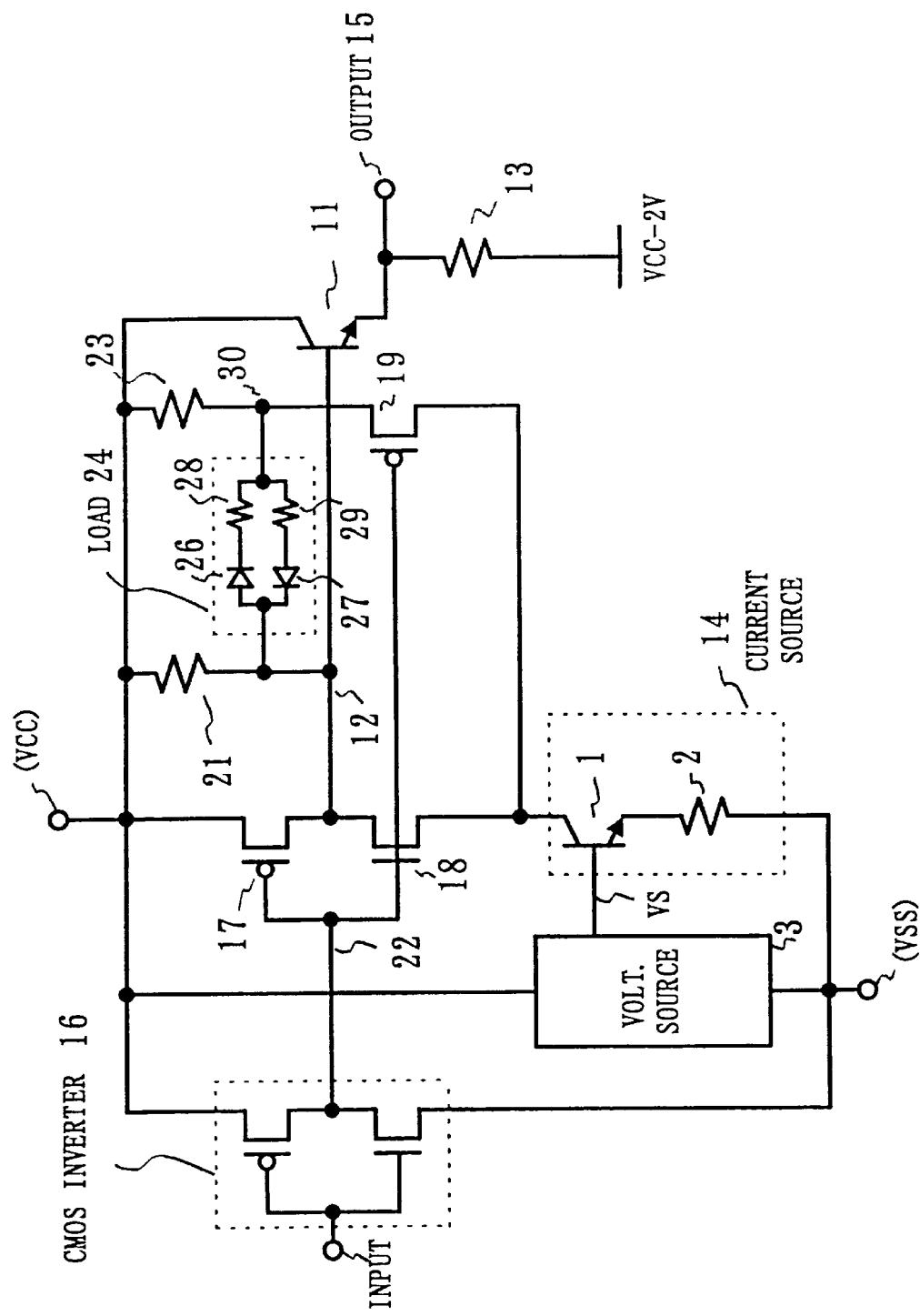
FIG. 5 is a first example of a circuit construction pertaining to the second embodiment of the present invention.

FIG. 5 is a first example of a circuit construction pertaining to the second embodiment of the present invention. In this example, a resistor 23 is connected as a second load between the PMOS transistor 19 and VCC, and a third load 24, which includes opposite polarity diodes 26 and 27 and resistors 28 and 29 connected in series therewith, is connected between the juncture 30 and the signal terminal 12. The operation of this example is basically the same as in the preceding examples. Assuming that the voltage VS generated by the voltage source VS is independent of temperature, when the NMOS and PMOS transistors 18 and 19 are on-off operated in the opposite phase relation to each other, the signal terminal 12 and the juncture 30 are brought to the "high" and "low" levels in the opposite phase relation to each other. The forward voltage across the diodes is reduced with increasing temperature. The "low" levels at the signal terminal 12 and the juncture 30 are approximately the terminal voltage across the resistor 2 multiplied by the resistivity thereof. However, the forward voltage across the bipolar transistor 1 is reduced with increasing temperature, that is, the terminal voltage across the resistor 2 is increased with increasing temperature. Consequently, the "low" levels at the signal terminal 12 and the juncture 30 are reduced with increasing temperature. However, the absolute value of the terminal potential difference of the third load 24 is increased irrespective of whether the signal terminal 12 brought to the "high" or "low" level. This means that the third load 24 carries a current which is increased with increasing temperature. Thus, by appropriately selecting the resistances of the resistors 23, 28 and 29 and the sizes of the diodes 26 and 27, it is possible to substantially eliminate the temperature dependency of the output potential at the output terminal 15, that is, provide an output level according to ECL100K standard, in a temperature range of about 0° C. to 120° C.

Figure 6:
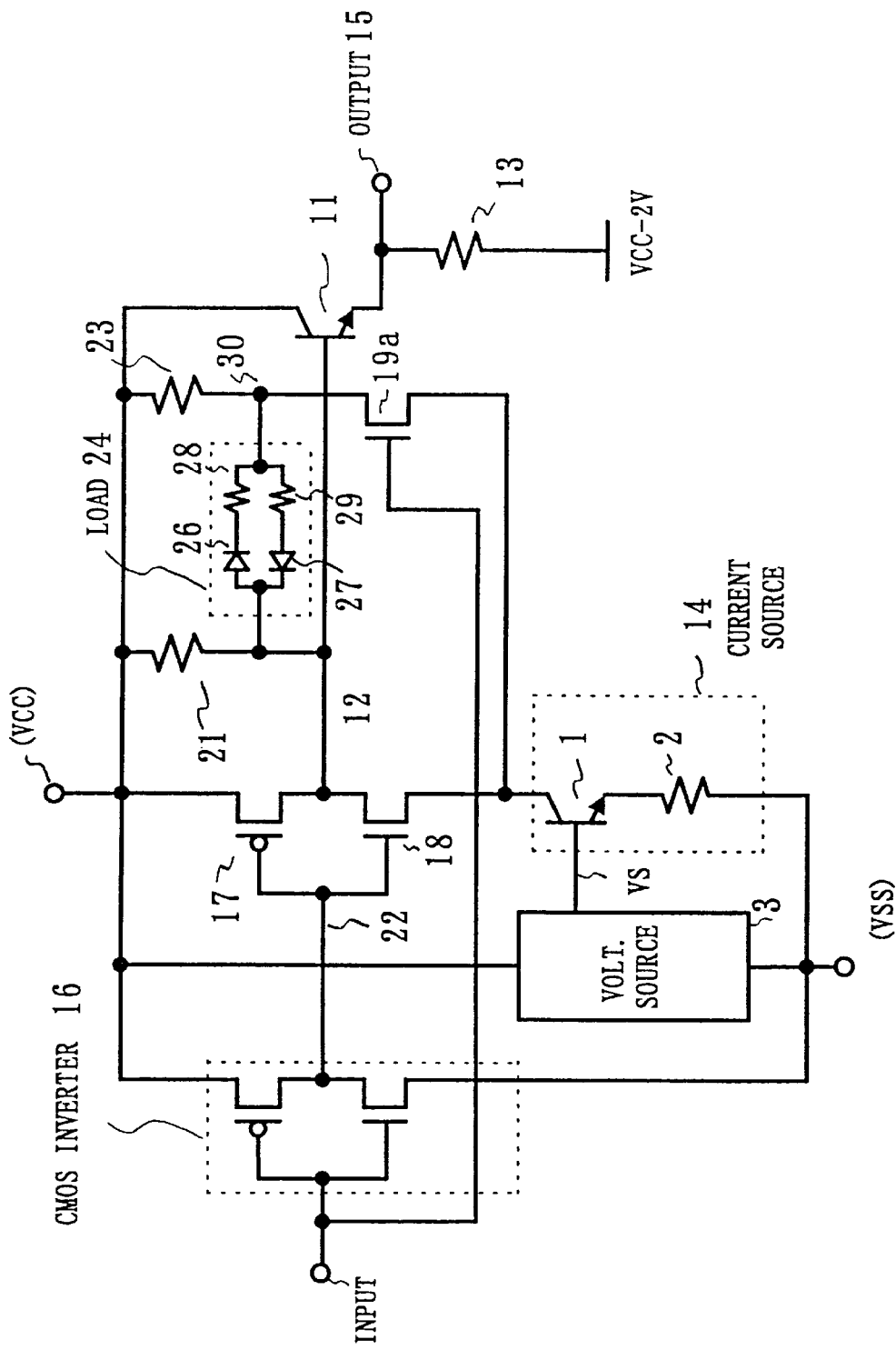
FIG. 6 shows a second example of a circuit construction pertaining to the second embodiment of the present invention.
Figure 7:
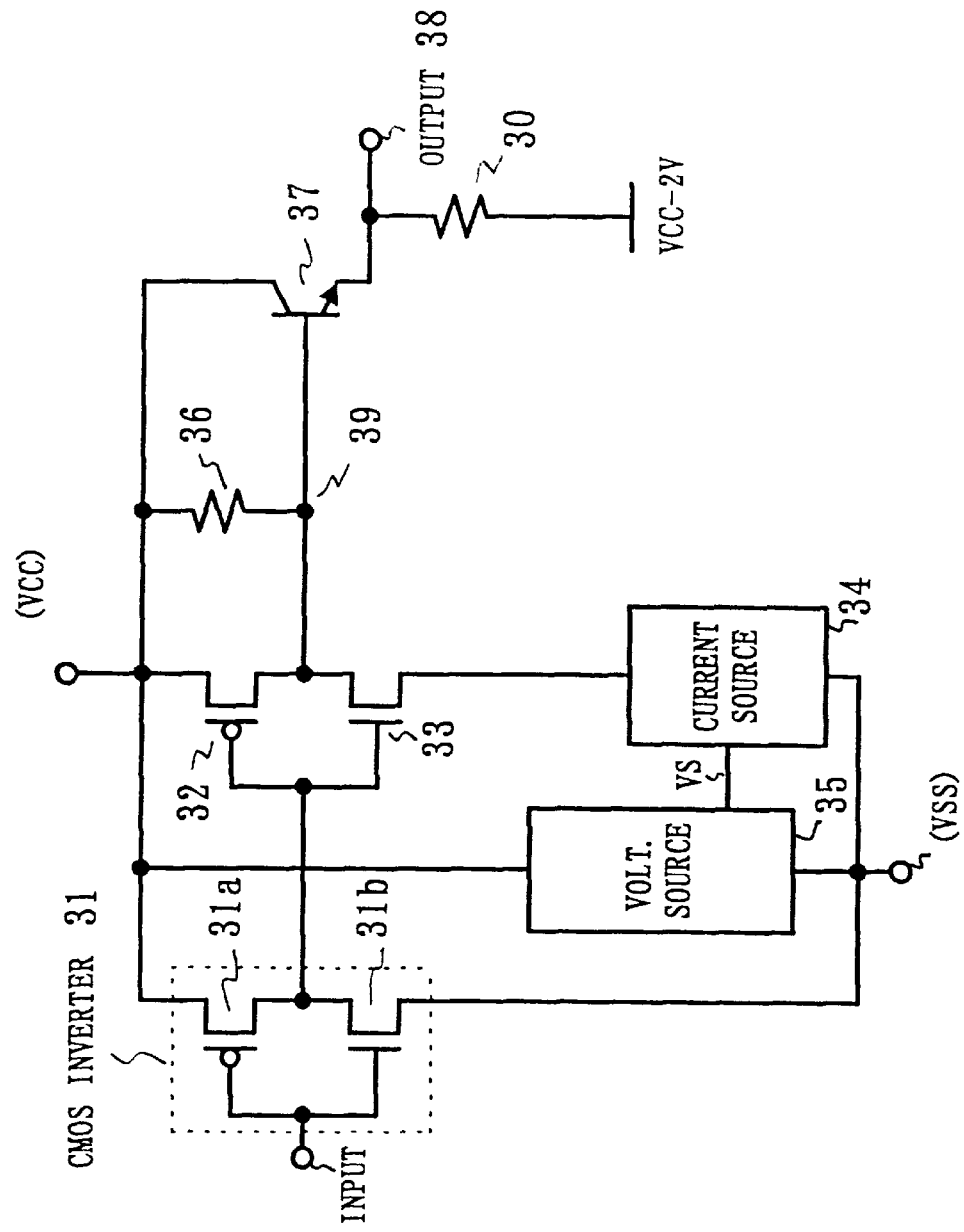
FIG. 7 shows a prior art output circuit which performs level conversion from the CMOS circuit level to the ECL circuit level.
Figure 8:
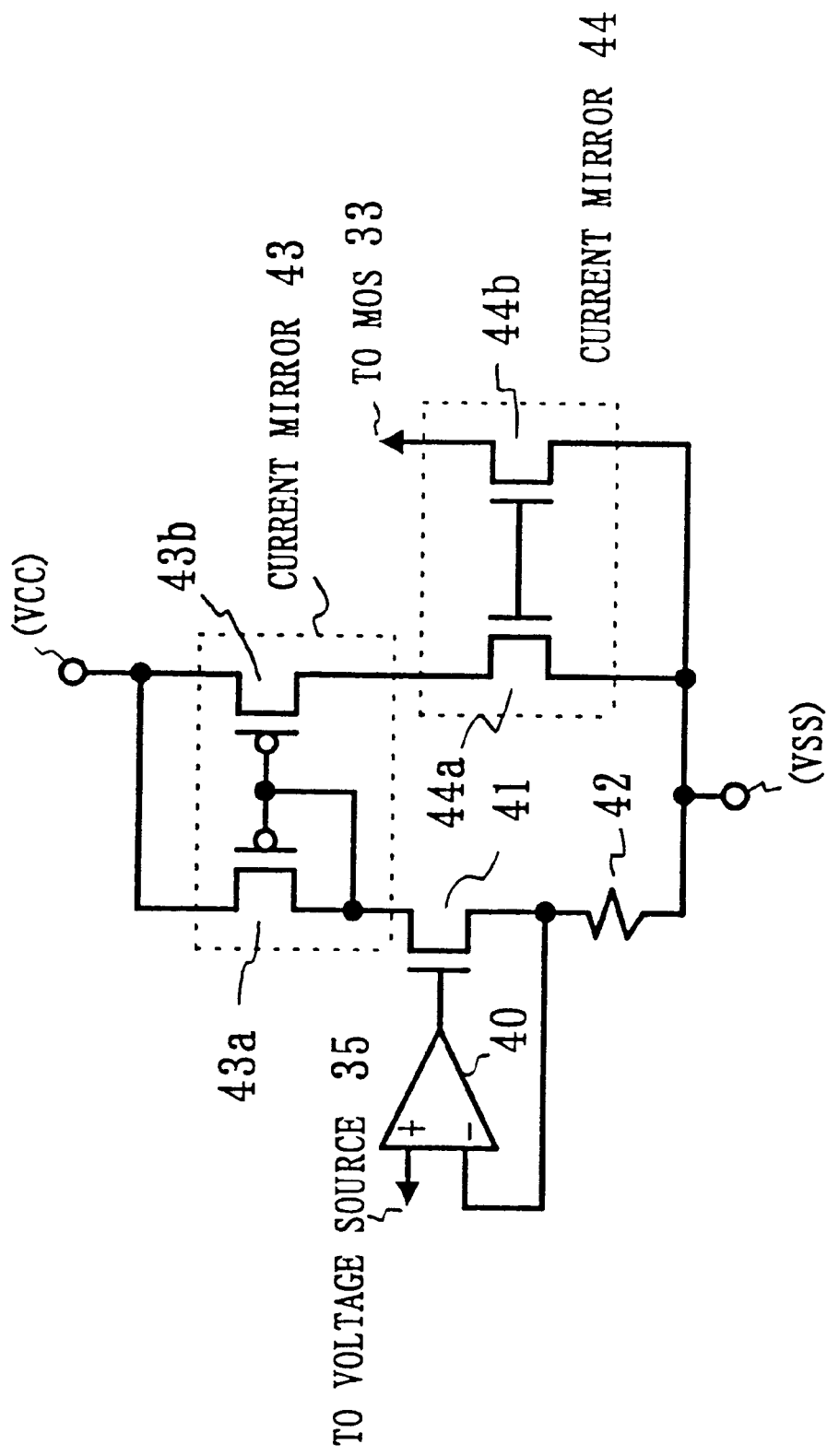
FIG. 8 shows a circuit of current source 34 in FIG. 7.

FIG. 6 shows a second example of a circuit construction pertaining to the second embodiment of the present invention. This example is the same as the preceding example except that an NMOS transistor 19a is used in lieu of the PMOS transistor 19 in the preceding example and has the gate connected not to the juncture 22 but to the CMOS inverter input terminal. In this construction, the NMOS transistors 18 and 19a are on-off operated in the opposite phase relation to each other. Usually, a PMOS transistor has less current supply capacity than an NMOS transistor. To provide the same current supply capacity, a PMOS transistor which has double the gate width of an NMOS transistor is used. With the PMOS transistor 19 used in FIG. 5 replaced by the NMOS transistor 19a used in FIG. 6, this example can further reduce the occupied area of the output circuit.

As has been described in the foregoing, in the output circuit according to the present invention, for converting the CMOS level to the ECL level, first, second and third switches are provided, a current source is constituted by a bipolar transistor and a resistor, and different current routes to the current source are provided when the ECL level is "high" and "low". It is thus possible to greatly reduce the number of circuit elements compared to the prior art output circuit comprising a current source, which includes MOS transistor current mirrors and an operational amplifier. An output circuit thus can be realized, which occupies a reduced area and is less prone to ECL output potential fluctuations due to fluctuations in manufacture. In addition, by providing a temperature-dependent load, it is possible to provide voltage outputs which comply with either the ECL10K or the ECL100K standard. Moreover, since either one of the second and third switches connected to the current source is always "on", the bipolar transistor constituting the current source has no possibility of losing the current path and being saturated, so it is possible to improve the reliability.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. An output circuit comprising:
a first load connected between a highest potential and a signal terminal for driving an output transistor
a first switch connected in parallel with the first load,
a second switch connected between the signal terminal and a current source,
the first and second switches being on-off operated by a CMOS level input to provide an ECL level from the output transistor, and
a third switch which is connected between the highest potential and the current source, the first to third switches being simultaneously on-off operated, the current source including a bipolar transistor coupled to a resistor.

2. The output circuit according to claim 1, wherein the first and third switches are simultaneously on-off operated in the same phase, and the second switch is on-off operated simultaneously with the first and third switches and in the opposite phase relation thereto.

3. The output circuit according to claim 1, wherein the bipolar transistor in the current source has a collector connected to the second and third switches, a base connected to a voltage source, and an emitter connected to a second potential which is lower than the highest potential.

4. The output circuit according to claim 1, wherein the first to third switches are each constituted by a MOS transistor.

5. The output circuit according to claim 3, which further comprises a capacitor connected in parallel with the current source.

6. The output circuit according to claim 1, which further comprises a second load connected between the highest potential and the third switch, and a third load connected between the terminals of the first and second loads other than those connected to the highest potential, the second load being temperature-dependent.

7. The output circuit according to claim 6, wherein the third load includes two parallel circuits each having a diode and a resistor in series therewith, the diodes being opposite in polarity to each other.

8. The output circuit according to claim 2, wherein the bipolar transistor in the current source has a collector connected to the second and third switches, a base connected to a voltage source, and an emitter connected to a second potential which is lower than the highest potential.

9. The output circuit according to claim 2, wherein the first to third switches are each constituted by a MOS transistor.

10. The output circuit according to claim 3, wherein the first to third switches are each constituted by a MOS transistor.

11. The output circuit according to claim 8, wherein the first to third switches are each constituted by a MOS transistor.

12. The output circuit according to claim 2, which further comprises a second load connected between the highest potential and the third switch, and a third load connected between the terminals of the first and second loads other than those connected to the highest potential, the second load being temperature-dependent.

13. The output circuit according to claim 3, which further comprises a second load connected between the highest potential and the third switch, and a third load connected between the terminals of the first and second loads other than those connected to the highest potential, the second load being temperature-dependent.

14. The output circuit according to claim 4, which further comprises a second load connected between the highest potential and the third switch, and a third load connected between the terminals of the first and second loads other than those connected to the highest potential, the second load being temperature-dependent.

15. The output circuit according to claim 8, which further comprises a second load connected between the highest potential and the third switch, and a third load connected between the terminals of the first and second loads other than those connected to the highest potential, the second load being temperature-dependent.

16. The output circuit according to claim 9, which further comprises a second load connected between the highest potential and the third switch, and a third load connected between the terminals of the first and second loads other than those connected to the highest potential, the second load being temperature-dependent.

17. The output circuit according to claim 10, which further comprises a second load connected between the highest potential and the third switch, and a third load connected between the terminals of the first and second loads other than those connected to the highest potential, the second load being temperature-dependent.

18. The output circuit according to claim 11, which further comprises a second load connected between the highest potential and the third switch, and a third load connected between the terminals of the first and second loads other than those connected to the highest potential, the second load being temperature-dependent.

19. An output circuit comprising:
a first load connected between a highest potential and a signal terminal for driving an output transistor
a first switch connected in parallel with the first load, a second switch connected between the signal terminal and a current source, a third switch connected between the highest potential and the current source,
the first to third switches being on-off operated according to a CMOS level input to provide an ECL level from an output transistor, and
the current source including a bipolar transistor coupled to a resistor.

20. An output circuit comprising:
an output bipolar transistor connected as an emitter follower, with the emitter connected to a resistor and to an output terminal, and the collector connected to a highest potential,
a first switch and a first load connected in parallel between the highest potential and a signal terminal, a current source connected via a second switch to the signal terminal, a third switch connected between the highest potential and the current source,
the current source including a bipolar transistor coupled to a resistor, and being operated by a supply voltage of a voltage source,
the first to third switches being on-off operated according to CMOS level inputs to input terminals, respectively and the first and third switches being simultaneously on-off operated in the same Phase, while the second switch being simultaneously reversely on-off operated in the opposite phase.

21. The output circuit according to claim 20, which further comprises:
a second load connected between the third switch and the highest potential, and
a third load being connected between the terminal of the second load other than that connected to the highest potential and the terminal of the first load other than that connected to the highest potential, and
the third load having a temperature-dependent current-voltage characteristic, and thereby carrying a current varying with temperature.

22. An output circuit comprising:
a CMOS inverter including a PMOS transistor and an NMOS transistor,
PMOS transistors as a first and a third switch, respectively, having gates thereof connected to the output line of the CMOS inverter, an NMOS transistor as a second switch,
a first resistor as a first load, which has one terminal connected to the drains of the PMOS and NMOS transistors of the first and second switches, respectively, and the other terminal connected to a highest potential,
an output bipolar transistor with the base thereof connected to the first resistor, and
a second resistor connected to the drain of the PMOS transistor of the third switch, and a current source including a bipolar transistor coupled to a resistor.

23. The output circuit according to claim 22, which further comprises a capacitor connected between the collector of the bipolar transistor of the current source and a second potential which is lower than the highest potential.

24. The output circuit according to claim 22, which further comprises a resistor connected as a second load between the PMOS transistor of the third switch and the highest potential, and
a third load which includes opposite polarity diodes and resistors connected in series therewith and is connected at one end to a juncture between the second load and the PMOS transistor of the third switch, and at the other end to the signal terminal.

25. An output circuit comprising:
a CMOS inverter including a PMOS transistor and an NMOS transistor,
a PMOS transistor as a first switch and an NMOS transistor as a second switch, each having a gate thereof connected to the output line of the CMOS inverter,
an NMOS transistor as a third switch, having a gate thereof connected to an input terminal of said CMOS inverter,
a first resistor as a first load, which has one terminal connected to the drains of the PMOS and NMOS transistors of the first and second switches, respectively, and the other terminal connected to a highest potential,
an output bipolar transistor with the base thereof connected to the first resistor,
the drain of the PMOS transistor of the third switch being connected to a current source including a bipolar transistor coupled to a resistor,
a second resistor connected as a second load between the NMOS transistor of the third switch and the highest potential, and
a third load which includes opposite polarity diodes and resistors connected in series therewith and is connected at one end to a juncture between the second load and the PMOS transistor of the third switch, and at the other end to the signal terminal.

26. An output circuit for receiving a CMOS level input and outputting an ECL level output, comprising:
a CMOS inverter including a PMOS transistor and an NMOS transistor having respective gates which are connected to a common CMOS level input terminal, and respective output terminals connected to a common output line,
first and second complementary MOS transistor switches having gates thereof connected to the output line of the CMOS inverter, and output terminals thereof connected together,
a third MOS transistor switch having a gate connected to said first and second switches for being switched simultaneously therewith,
a first load having one end connected to said output terminals of the first and second switches, and the other end connected to a first power supply terminal for being connected to a highest potential, an output bipolar transistor with the base thereof connected to a juncture of the first load and the output terminals of the first and second switches, and a first conductive terminal of said third MOS transistor switch being connected to a current source which includes a bipolar transistor coupled to a resistor.

27. The output circuit according to claim 26, wherein the bipolar transistor in the current source has a collector connected to the second and third switches, a base connected to a voltage source, and an emitter connected to a second power supply terminal for being connected to a second potential which is lower than said highest potential.

28. The output circuit according to claim 27, wherein said emitter is connected to said second power supply terminal via a resistor.

29. The output circuit according to claim 26, wherein said output bipolar transistor has a collector connected to said first power supply terminal and an emitter connected to an output terminal of said output circuit for supplying an ECL level output.

30. The output circuit according to claim 29, wherein said output terminal of said output circuit is connected via a resistor to a reference potential.

31. The output circuit according to claim 26, wherein said third transistor switch has a second conductive terminal connected to said first power supply terminal.

32. The output circuit according to claim 31, wherein said second conductive terminal of said third transistor switch is connected directly to said first power supply terminal and said first conductive terminal of said third transistor switch is connected to said current source via a resistor.

33. The output circuit according to claim 32, further comprising a capacitor connected between the collector of the bipolar transistor of the current source and said second power supply terminal.

34. The output circuit according to claim 31, further comprising a capacitor connected between the collector of the bipolar transistor of the current source and said second power supply terminal.

35. The output circuit according to claim 31, wherein the second conductive terminal of the third transistor switch is connected to the first power supply terminal by a second load, and further comprising a third load which has a temperature-dependent current-voltage characteristic, said third load being connected at one end to a juncture between the second load and the third transistor switch, and at the other end to the output terminals of the first and second transistor switches.

36. The output circuit according to claim 35, wherein the first conductive terminal of the third transistor switch is connected directly to said current source.

37. The output circuit according to claim 26, wherein said third transistor switch is a PMOS transistor and has a gate connected to the gates of the first and second transistor switches.

38. The output circuit according to claim 26, wherein said third transistor switch is an NMOS transistor and has a gate connected to the input terminal of the CMOS inverter.

* * * * *